US010868154B2

(12) United States Patent
Ramvall et al.

(10) Patent No.: US 10,868,154 B2
(45) Date of Patent: Dec. 15, 2020

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Peter Ramvall, Lund (SE); Matthias Passlack, Huldenberg (BE); Gerben Doornbos, Kessel-Lo (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/726,039

(22) Filed: Dec. 23, 2019

(65) Prior Publication Data

US 2020/0135906 A1 Apr. 30, 2020

Related U.S. Application Data

(62) Division of application No. 16/007,163, filed on Jun. 13, 2018, now Pat. No. 10,516,039.

(Continued)

(51) Int. Cl.

| | |
|---|---|
| ***H01L 21/00*** | (2006.01) |
| ***H01L 29/66*** | (2006.01) |
| ***H01L 27/092*** | (2006.01) |
| ***H01L 29/04*** | (2006.01) |
| ***H01L 29/20*** | (2006.01) |

(Continued)

(52) U.S. Cl.

CPC .... *H01L 29/66977* (2013.01); *H01L 21/0254* (2013.01); *H01L 21/02609* (2013.01); *H01L 21/8252* (2013.01); *H01L 21/823885* (2013.01); *H01L 27/092* (2013.01); *H01L 29/045* (2013.01); *H01L 29/2003* (2013.01); *H01L 29/205* (2013.01); *H01L 29/42392* (2013.01); *H01L 29/66522* (2013.01); *H01L 29/66742* (2013.01); *H01L 29/78618* (2013.01); *H01L 29/78642* (2013.01); *H01L 29/78681* (2013.01); *H01L 21/823821* (2013.01); *H01L 21/845* (2013.01); *H01L 27/0886* (2013.01);

(Continued)

(58) Field of Classification Search

CPC ......... H01L 29/42392; H01L 29/66439; H01L 29/775

See application file for complete search history.

(56) References Cited

U.S. PATENT DOCUMENTS

| | | | | |
|---|---|---|---|---|
| 7,560,725 B2 * | 7/2009 | Koike | .................... | B82Y 20/00 257/12 |
| 9,209,247 B2 | 12/2015 | Colinge et al. | | |

(Continued)

OTHER PUBLICATIONS

Wenjun Li et al., "Polarization-Engineered III-Nitride Heterojunction Tunnel Field-Effect Transistors", IEEE Journal on Exploratory Solid-State Computational Devices and Circuits, vol. 1, (2015), 28-34.

*Primary Examiner* — Nicholas J Tobergte

(74) *Attorney, Agent, or Firm* — Maschoff Brennan

(57) ABSTRACT

A method includes forming a first epitaxial layer having a first dopant over a substrate; etching the first epitaxial layer to form a fin with a polar sidewall; and forming in sequence a semiconductor interlayer and a second epitaxial layer to surround the fin, in which the second epitaxial layer has a second dopant with a different conductivity type than the first dopant.

20 Claims, 15 Drawing Sheets

Related U.S. Application Data

(60) Provisional application No. 62/593,065, filed on Nov. 30, 2017.

(51) Int. Cl.

| | |
|---|---|
| ***H01L 29/205*** | (2006.01) |
| ***H01L 29/423*** | (2006.01) |
| ***H01L 29/786*** | (2006.01) |
| ***H01L 21/8238*** | (2006.01) |
| ***H01L 21/02*** | (2006.01) |
| ***H01L 21/8252*** | (2006.01) |
| *H01L 29/417* | (2006.01) |
| *H01L 21/84* | (2006.01) |
| *H01L 27/088* | (2006.01) |
| *H01L 29/775* | (2006.01) |

(52) U.S. Cl.

CPC .. *H01L 29/41725* (2013.01); *H01L 29/66439* (2013.01); *H01L 29/775* (2013.01)

(56) References Cited

U.S. PATENT DOCUMENTS

| | | | | |
|---|---|---|---|---|
| 9,236,267 | B2 | 1/2016 | De et al. | |
| 9,299,562 | B2 | 3/2016 | Lochtefeld | |
| 9,318,583 | B2 | 4/2016 | Verhulst | |
| 9,362,369 | B2 * | 6/2016 | Then | H01L 21/283 |
| 9,385,195 | B1 * | 7/2016 | Zhang | H01L 29/66795 |
| 9,412,817 | B2 | 8/2016 | Yang et al. | |
| 9,412,828 | B2 | 8/2016 | Ching et al. | |
| 9,425,296 | B2 | 8/2016 | Li | |
| 9,450,094 | B1 * | 9/2016 | Yeh | H01L 29/0653 |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 9,627,540 | B1 * | 4/2017 | Chen | H01L 29/456 |
| 9,929,273 | B2 * | 3/2018 | Rachmady | H01L 21/30625 |
| 10,249,744 | B2 | 4/2019 | Zhao | |
| 10,269,923 | B2 | 4/2019 | Chen et al. | |
| 10,297,714 | B1 * | 5/2019 | Ma | H01L 33/32 |
| 10,381,465 | B2 | 8/2019 | Sun | |
| 10,438,948 | B2 | 10/2019 | Wang | |
| 10,461,216 | B2 * | 10/2019 | Brown | H01L 33/007 |
| 10,505,025 | B1 * | 12/2019 | Doornbos | H01L 29/0657 |
| 10,516,039 | B2 * | 12/2019 | Ramvall | H01L 29/42392 |
| 2014/0162438 | A1 | 6/2014 | Lochtefeld | |
| 2015/0069473 | A1 | 3/2015 | Glass | |
| 2017/0125521 | A1 | 5/2017 | Fay et al. | |
| 2017/0125555 | A1 | 5/2017 | Fay et al. | |
| 2017/0221890 | A1 | 8/2017 | Wang | |
| 2018/0323291 | A1 | 11/2018 | Zhao | |
| 2019/0393351 | A1 * | 12/2019 | Beattie | H01L 29/66742 |
| 2020/0006473 | A1 * | 1/2020 | Ramvall | H01L 29/0688 |
| 2020/0135855 | A1 * | 4/2020 | Holland | H01L 21/02532 |

* cited by examiner

SEMICONDUCTOR DEVICE AND MANUFACTURING METHOD THEREOF

PRIORITY CLAIM AND CROSS-REFERENCE

The present application is a Divisional application of U.S. application Ser. No. 16/007,163, filed on Jun. 13, 2018, now U.S. Pat. No. 10,516,039, issued on Dec. 24, 2019, which claims priority of U.S. Provisional Application Ser. No. 62/593,065, filed Nov. 30, 2017, which is herein incorporated by reference in their entireties.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. Field effect transistors (FETs) are widely used in integrated chips. FETs comprise a source, a drain, and a gate. A large subthreshold slope (i.e., a small subthreshold swing) is typically desired since it improves the ratio between on and off currents, and therefore reduces leakage currents.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
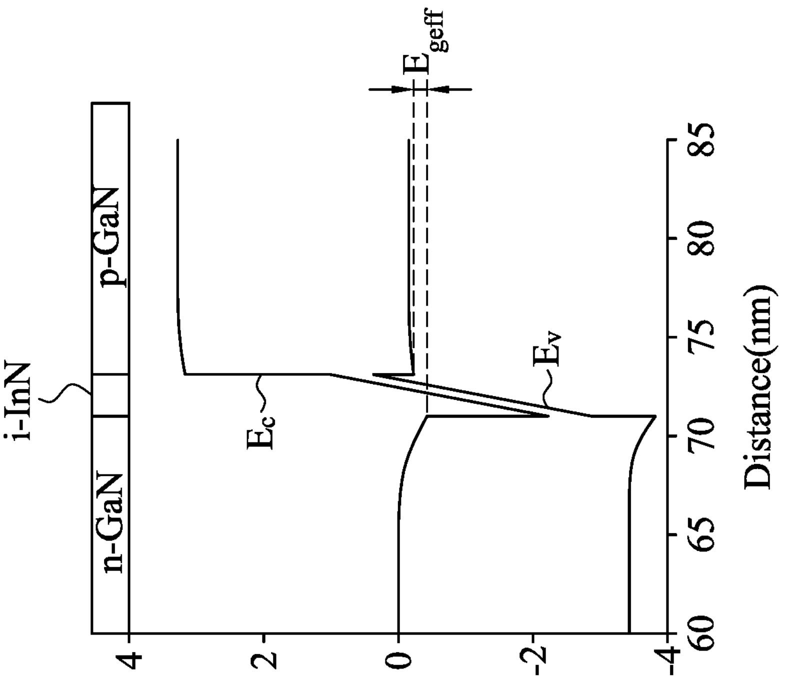
FIG. 1B is a band diagram for an example semiconductor device including polar GaN/InN/polar GaN heterojunctions with 2.4 nm InN layer thickness.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Tunnel field-effect transistor is (TFET) a promising candidate to replace metal-oxide-semiconductor field-effect transistor (MOSFET) in low-voltage, energy-efficient and ultra-scaled integrated circuits. By using quantum-mechanical tunneling instead of thermionic emission, TFET have the potential to achieve switching slopes (SS) less than 60 mV/decade. TFET devices using III-V materials with narrow band gaps, such as indium arsenide (InAs) and gallium antimonide (GaSb), achieve a high on-current ($I_{ON}$), but these devices also show a large off-current ($I_{OFF}$) and as such, may not achieve an acceptable $I_{ON}/I_{OFF}$ ratio.

In order to lower $I_{OFF}$, a TFET device may use group III-V compounds exhibiting wide band gaps as semiconductor materials as a substitute for group III-V compounds exhibiting narrow band gaps. Candidate group III-V compounds exhibiting wide band gaps include group III-nitrides, such as, for example, gallium nitride (GaN), aluminum nitride (AlN) or the like. As used herein, the term "narrow band gap" may refer to a band gap less than the band gap of Silicon, (e.g., less than 1.1 electron volt (eV) or less than 0.7 eV), or a band gap less than a wide band gap. As used herein, the term "wide band gap" may refer to a band gap greater than the band gap of Indium Nitride (InN) (i.e., 0.7 eV) or a band gap greater than 3.0 eV.

However, for devices utilizing group III-nitrides compounds, the wide band gap may frustrate interband tunneling in group III-nitride homojunctions. Thus, embodiments of the present disclosure provide the TFET based on group III-nitride compound heterojunctions through the use of polarization engineering. Through polarization engineering of the heterostructure, a polarization-induced charge can be used to generate large internal electric fields. At sufficiently high electric fields, interband tunneling can become significant even in large band gap materials (e.g., III-nitride materials).

Figure 1A:
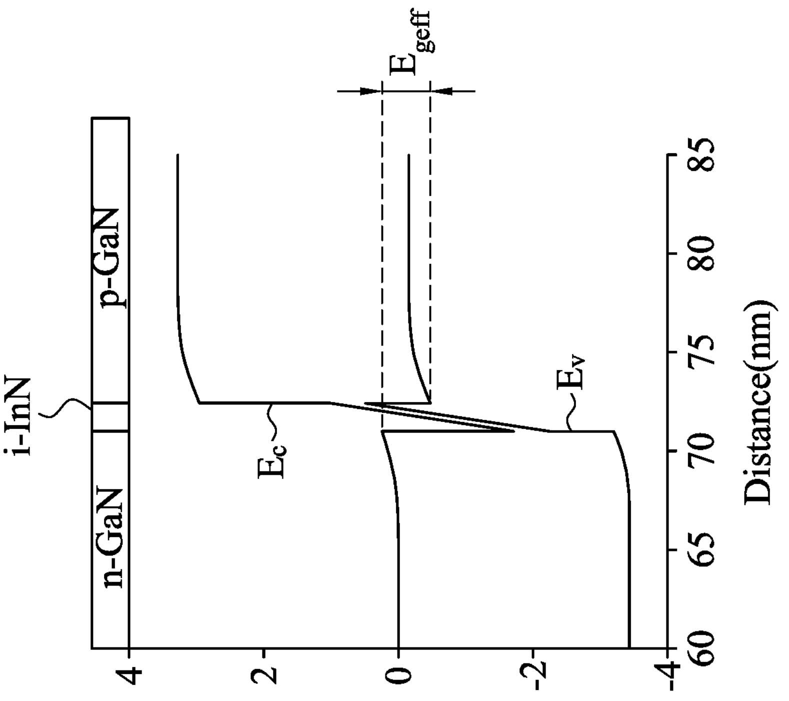
FIG. 1A is a band diagram for an example semiconductor device including polar GaN/InN/polar GaN heterojunctions with 1.4 nm InN layer thickness.

To illustrate the concept of interband tunneling in III-nitride heterojunctions, FIGS. 1A and 1B show example band diagrams for two polar GaN/InN/polar GaN heterostructures. FIG. 1A is a band diagram for an example semiconductor device including polar GaN/InN/polar GaN heterojunctions with 1.4 nm InN layer thickness. FIG. 1B is a band diagram for an example semiconductor device including polar GaN/InN/polar GaN heterojunctions with 2.4 nm InN layer thickness. In the examples illustrated in FIGS. 1A and 1B, the offset between the p-GaN valence band (Ev) edge at the polar p-GaN/InN interface and the n-GaN conduction band (Ec) edge at the polar n-GaN/InN interface can be considered as an effective band gap $E_{geff}$. In the example illustrated in FIG. 1A, the energy band is a staggered-gap alignment and $E_{geff}$ is approximately 0.64 eV, which is practical to realize the interband tunneling. In the example illustrated in FIG. 1B, when the thickness of the InN layer is increased to 2.4 nm, a broken-gap alignment occurs and $E_{geff}$ is approximately −0.37 eV, which is practical to realize the interband tunneling as well. As described in further detail below, this property, i.e., that the thickness of the InN layer in a polar GaN/InN/polar GaN heterojunction may change band gap characteristics, may enable a diverse range of TFETs to be developed. For example, the polar GaN/InN/polar GaN heterojunction with the staggered band gap alignment may result in low off-current and the polar GaN/InN/polar GaN heterojunction with the broken band gap alignment may result in high on-current. In some embodiments, when the thickness of the InN layer is increased over 3 nm, the on-current may be unsatisfactory for the TFET because of an increased tunneling distance.

Moreover, GaN is most stable in the hexagonal wurtzite crystal structure, in which the structure is described by two (or three) equivalent basal plane axes that are rotated 120° with respect to each other (the a-axes), all of which are perpendicular to a unique c-axis. A plane that intersects with the c axis at right angles is called a "c-plane." A plane that is parallel to the c-axis and intersects with the c plane at right angles is called a "m-plane." Moreover, the wurtzite crystal structure further includes the "a-plane," which refers herein to a (11-20) plane that intersects with the [11-20] direction of the wurtzite crystal structure at right angles. In this case, the "c-plane" is a generic term that collectively refers to a family of planes including (0001) and (000-1) planes, the "m-plane" is a generic term that collectively refers to a family of planes including (1-100), (10-10), (−1010), (−1100), (01-10) and (0-110) planes.

Figure 1C:
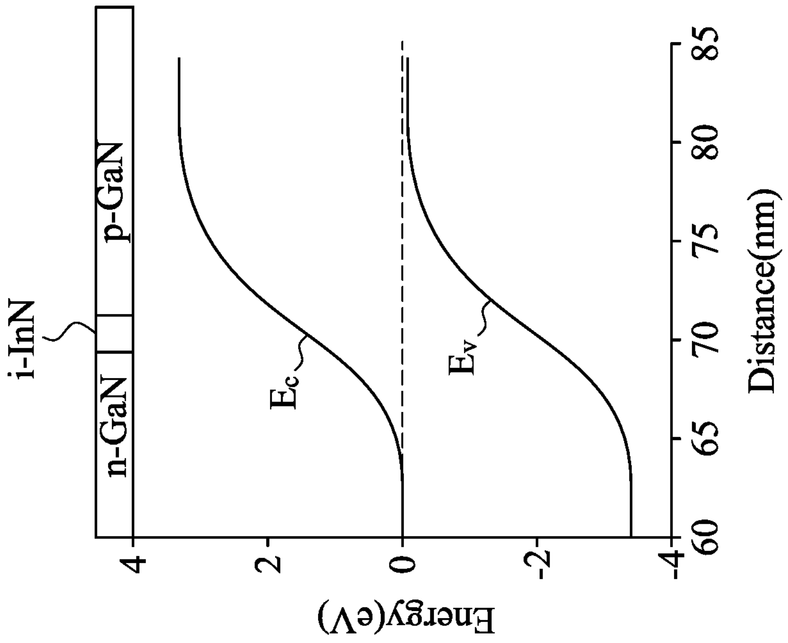
FIG. 1C is a band diagram of example semiconductor device including non-polar GaN/InN/non-polar GaN heterojunctions.

Group III and nitrogen atoms occupy alternating c-planes along the crystal's c-axis. The symmetry elements included in the wurtzite structure dictate that III-nitrides possess a bulk spontaneous polarization along this c-axis. Furthermore, as the wurtzite crystal structure is non-centrosymmetric, wurtzite nitrides can additionally exhibit piezoelectric polarization, also along the crystal's c-axis. Stated differently, c-planes of the III-nitride material are polar planes, while m-planes and a-planes of the III-nitride material are non-polar planes. The polar c-planes may enable interband tunneling, as demonstrated by FIGS. 1A and 1B. However, interband tunneling might not occur at non-polar planes. For example, FIG. 1C is a band diagram of example semiconductor device including non-polar GaN/InN/non-polar GaN heterojunctions. As illustrated in FIG. 1C, the large bandgap of the non-polar GaN/InN/non-polar GaN junction results in a large tunneling barrier (about 3.4 eV), which impedes the interband tunneling through the non-polar GaN/InN/non-polar GaN junction. As a result, embodiments of the present disclosure provide a core-shell fin-type TFET having a III-nitride core oriented in such a way that long sides (also referred to as sidewalls in this context) of the III-nitride core extend along polar c-planes, rather than non-polar planes, so as to improve the active area as well as the device performance of the TFET.

Figure 2:
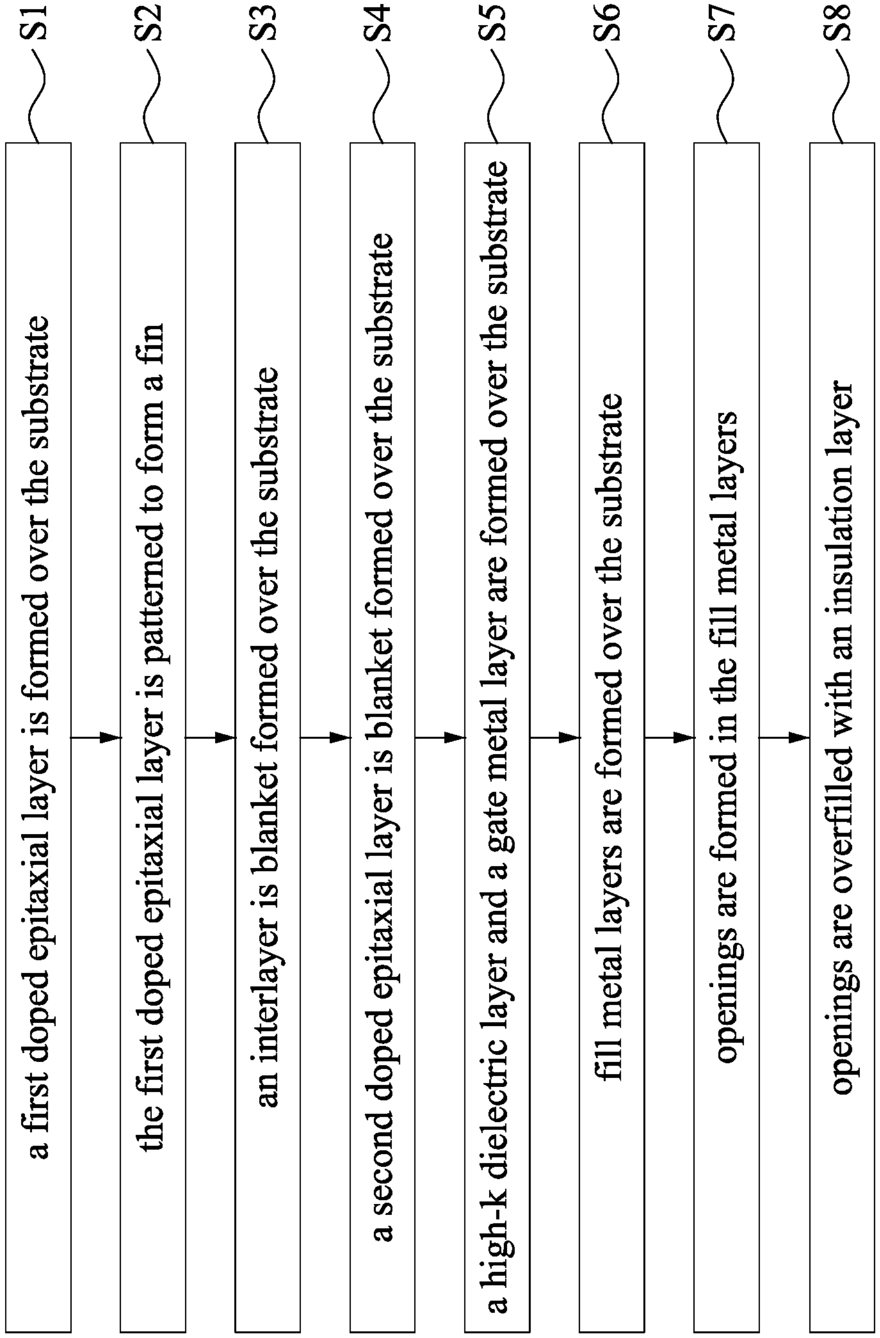
FIG. 2 is a method of a manufacturing process of a TFET in accordance with some embodiments of the present disclosure.

Illustrated in FIG. 2 is a method of a manufacturing process of a TFET in accordance with some embodiments of the present disclosure. FIGS. 3, 4A, 5, 6A and 7-12 are cross-sectional views of a TFET at various stages of the method of FIG. 2 in some embodiments. FIGS. 4B, 4C, 6B and 6C are top views of the TFET at various stages of the method of FIG. 2 in some embodiments. The illustration is merely exemplary and is not intended to be limiting beyond what is specifically recited in the claims that follow. It is understood that additional operations may be provided before, during, and after the operations shown by FIG. 2, and some of the operations described below can be replaced or eliminated for additional embodiments of the method. The order of the operations/processes may be interchangeable.

Figure 3:
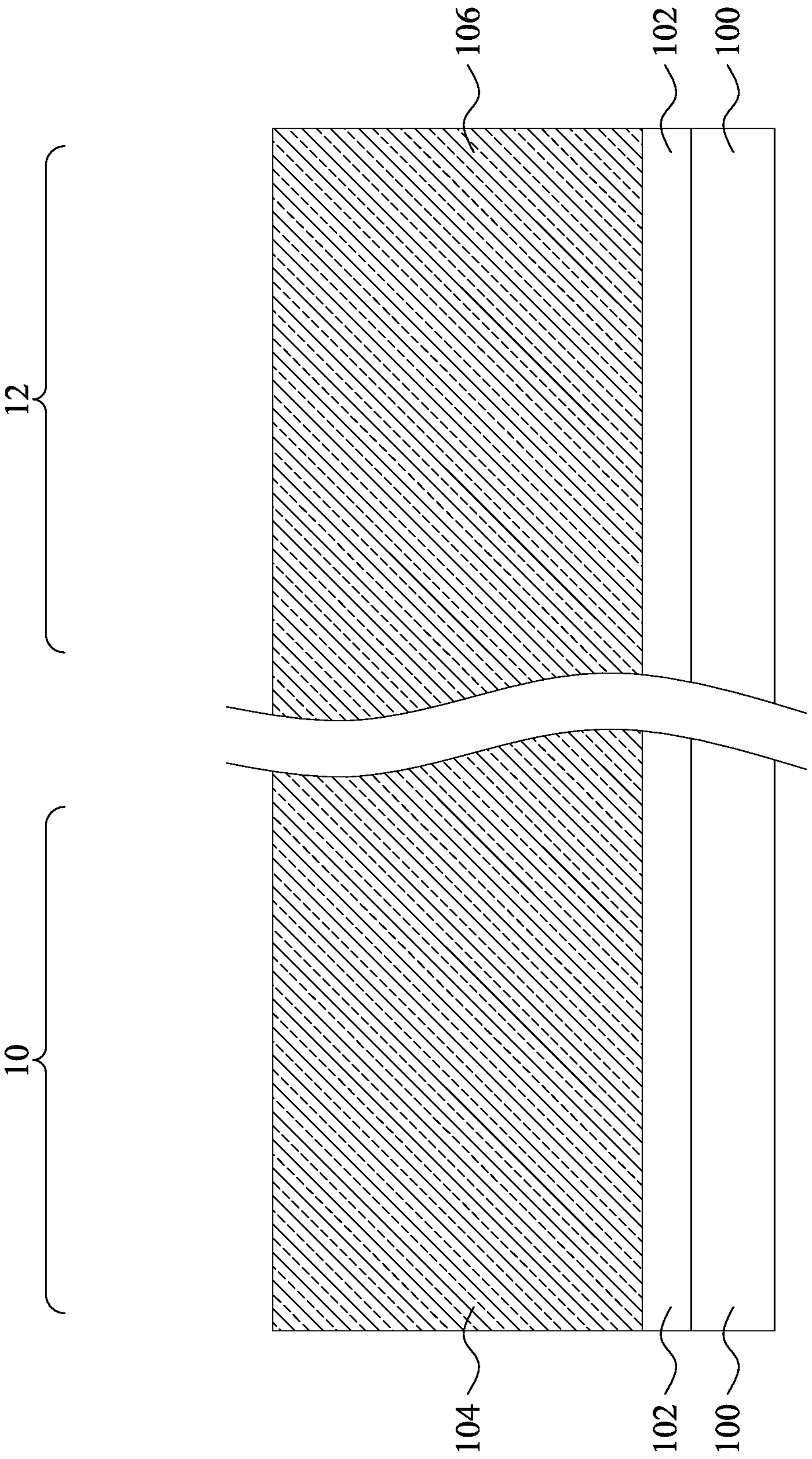
FIGS. 3, 4A, 5, 6A and 7-12 are cross-sectional views of a TFET at various stages of the method of FIG. 2 in some embodiments.

The method begins at operation S1 where a first doped epitaxial layer is formed over the substrate. With reference to FIG. 3, in some embodiments of operation S1, first doped epitaxial layers 104 and 106 are formed over a substrate 100. As shown in FIG. 3, the first doped epitaxial layer 104 is formed over a first region 10 of the substrate 100, and the first doped epitaxial layer 106 is formed over a second region 12 of the substrate 100. In some embodiments, the first region 10 may be for forming p-type devices, such as p-type TFETs, and the second region 12 may be for forming n-type devices, such as n-type TFETs. In some embodiments, the substrate 100 is a monocrystalline silicon substrate. Alternatively, the substrate 100 may comprise a multilayer structure such as a semiconductor-on-insulator (SOI) structure, which has a buried oxide layer between two silicon layers. The substrate 100 may also be formed of other commonly used materials, such as sapphire, SiGe, SiC, Ge, ZnO, ZnSe, ZnS, GaP, or GaAs. FIG. 3 also illustrates an optional buffer layer 102. In the embodiment shown in FIG. 3, the buffer layer 102 is formed on the substrate 100, followed by forming the first doped epitaxial layers 104 and 106 on the buffer layer 102. Within this disclosure the term buffer layer 102 refers to a layer of material selected from the group of a III-V compound semiconductor, such as a III-nitride semiconductor (for example, AlN), a metal nitride, a metal carbide, a metal carbon nitride, a pure metal, a metal alloy, or a silicon-containing material. The buffer layer 102 may comprise the same, or similar materials as the overlying III-V compound semiconductor layer, as will be discussed further below. In some embodiments, the buffer layer 102 is formed using physical vapor deposition (PVD) or chemical vapor deposition (CVD), for example.

In some embodiments, the first doped epitaxial layers 104 and 106 are grown starting from the buffer layer 102 using epitaxial layer overgrowth (ELOG). For example, first doped epitaxial layer 104 and 106 may be formed at a temperature higher than the formation temperature of the buffer layer 102, hence forming a crystalline structure as compared to the more amorphous structure in the buffer layer 102. In some embodiments, first doped epitaxial layer 104 and 106 are III-nitride semiconductor layers including a material selected from GaN, InN, AlN, $In_xGa_{(1-x)}N$, $Al_xGa_{(1-x)}N$, $Al_xIn_{(1-x)}N$, $Al_xIn_yGa_{(1-x-y)}N$, the like, and combinations thereof. The formation methods include metal organic CVD (MOCVD), also known as metal organic vapor phase epitaxy (MOVPE), plasma enhanced CVD (PECVD), remote plasma enhanced CVD (RP-CVD), and molecular beam epitaxy (MBE).

In some embodiments where the first doped epitaxial layers 104 and 106 are III-nitride semiconductor layers, growth direction of the first doped epitaxial layers 104 and 106 are designed to be along non-polar directions. Therefore, the growth direction of the III-nitride semiconductor layers 104 and 106 may be (1-100) and (11-20) in some embodiments. Growth directions of the first doped epitaxial layers 104 and 106 are associated with crystal orientation of the underlying substrate 100. Therefore, in some embodiments where the substrate 100 is a silicon substrate having a (112) crystal orientation (i.e. the top surface of the substrate 100 extending along a (112) plane), the first doped epitaxial layers 104 and 106 have a (1-100) crystal orientation, which means that the top surfaces of the first doped epitaxial layers 104 and 106 extend along the (1-100) plane. Moreover, in some embodiments where the substrate 100 is a silicon substrate having a (110) crystal orientation, the first doped epitaxial layers 104 and 106 have a (11-20) crystal orientation, which means that the top surfaces of the first doped epitaxial layers 104 and 106 extend along the (11-20) plane.

In some embodiments where the first doped epitaxial layer 104 for the p-type TFET region 10 is GaN, the GaN layer 104 is doped by an n-type dopant, such as, but not limited to, silicon, oxygen, or a combination thereof. In some embodiments where the first doped epitaxial layer 106 for the n-type TFET region 12 is GaN, the doped GaN layer 106 is doped by a p-type dopant, such as, but not limited to, magnesium, calcium, zinc, beryllium, carbon, and combinations thereof. Since doping the first GaN layers 104 and 106 are performed prior to the subsequent patterning process of the GaN layers 104 and 106 and formation of epitaxial layers, the subsequently formed epitaxial layers will be free from the dopants in the first GaN layers 104 and 106.

Figure 4A:
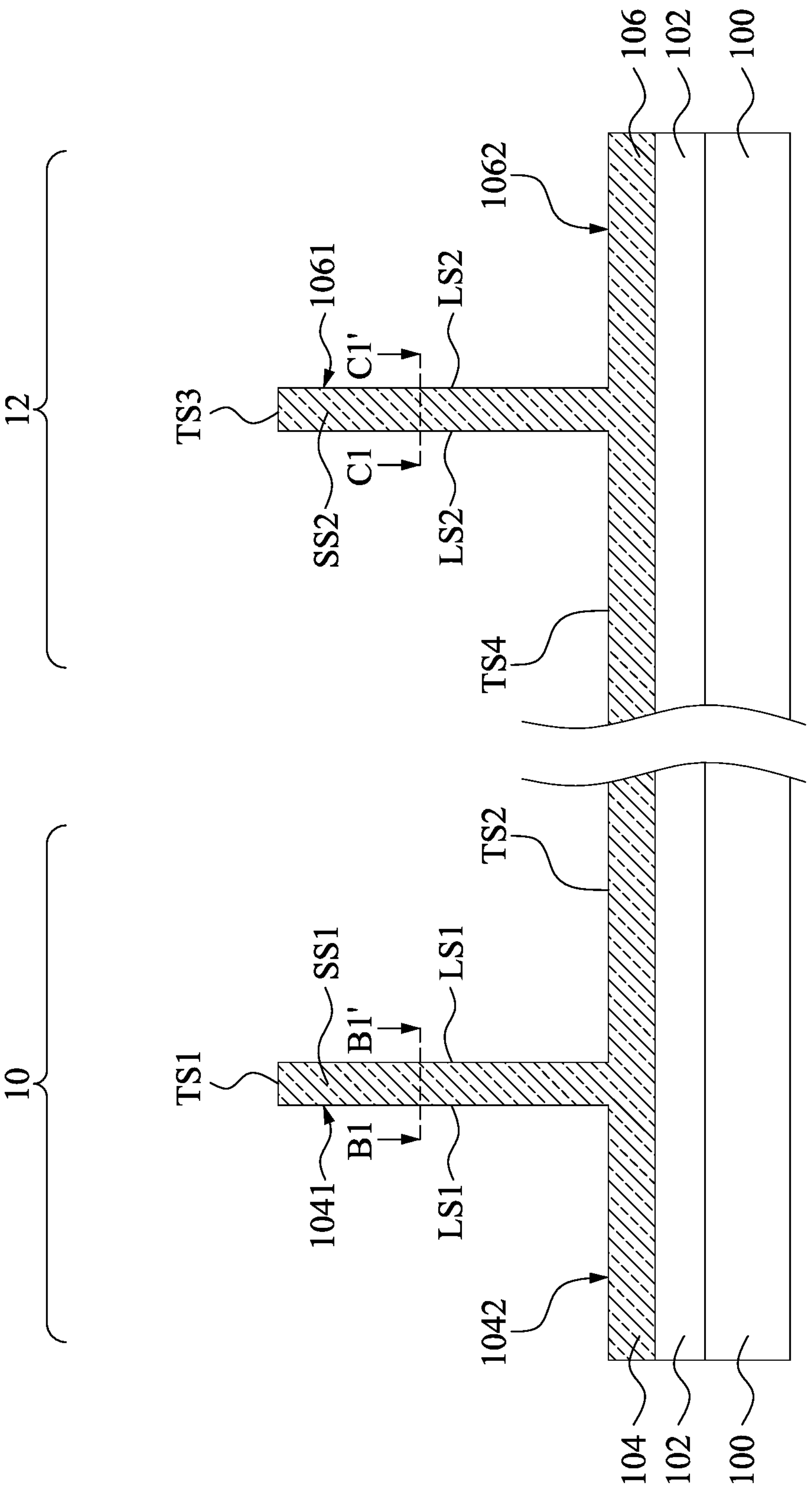
Figure 4C:
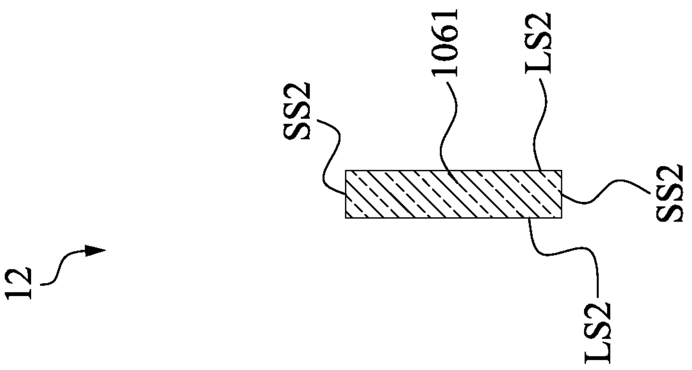
FIGS. 4B, 4C, 6B and 6C are top views of the TFET at various stages of the method of FIG. 2 in some embodiments.
Figure 4B:
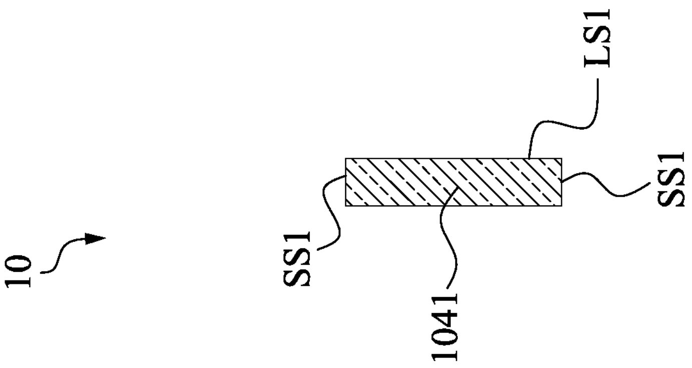

Returning to FIG. 2, the method then proceeds to operation S2 where the first doped epitaxial layers are patterned to form fins. After the bulk GaN is provided, selected portions are removed to leave fins with long sides (i.e., sidewalls) oriented to the c-planes. For example, trenched having prescribed dimensions (e.g., shapes) can be etched in to the bulk GaN. Such trenches can be formed using suitable photolithography techniques or reactive ion etching (RIE) processes. As illustrated in FIGS. 4A, 4B and 4C, remaining n-type GaN layer 104 and p-type GaN layer 106 can respectively include an n-type fin 1041 and a p-type fin 1061. The n-type fin 1041 and the p-type fin 1061 have long sides (i.e., sidewalls) LS1 and LS2 that extend along one of the polar planes (e.g., c-plane, such as (0001) and (000-1) plane) of the wurtzite crystal structure, while horizontal portions 1042 and 1062 of the etched GaN layers 104 and 106 remain oriented to the non-polar plane (e.g., m-plane or a-plane). In further embodiments, the long sides LS1 of the n-type fin 1041 extend along different c-planes. For example, one long side LS1 extends along the (0001) plane, and the other long side LS1 extends along the (000-1) plane. Similarly, the long sides LS2 of the p-type fin 1061 extend along different c-planes. For example, one long side LS2 extends along the (0001) plane, and the other long side LS2 extends along the (000-1) plane.

Moreover, short sides SS1 of the fin 1041 and short sides SS2 of the fin 1061 extend along non-polar planes such as a-planes (e.g., (11-20) plane) or m-planes (e.g., (1-100) plane). In some embodiments, thicknesses of the n-type fin 1041 and p-type fin 1061 and thicknesses of the horizontal portions 1042 and 1062 are thick enough to allow low dislocation density, for example, about lower than $10^8$ cm$^{-2}$, of the subsequently formed epitaxial layers, which in turn will improve the yield of the TFET devices.

As shown in FIG. 4A, in some embodiments, the n-type fin 1041 has a top surface TS1, and the horizontal portion 1042 has a top surface TS2. Since the top surface TS1 of the n-type fin 1041 and top surface TS2 of the horizontal portion 1042 represent the growth direction of the first doped epitaxial layer 104, in some embodiments where the growth direction of the first doped epitaxial layer 104 is (11-20) direction, the top surface TS1 of the n-type fin 1041 and the top surface TS2 of the horizontal portion 1042 of the first doped epitaxial layer 104 may have (11-20) crystal orientation, which means that the top surface TS1 of the n-type fin 1041 and the top surface TS2 of the horizontal portion 1042 extend along the (11-20) plane. In some embodiments where the growth direction of the first doped epitaxial layer 104 is (1-100) direction, the top surface TS1 of the n-type fin 1041 and the top surface TS2 of the horizontal portion 1042 of the first doped epitaxial layer 104 may have (1-100) crystal orientation, which means that the top surface TS1 of the n-type fin 1041 and the top surface TS2 of the horizontal portion 1042 extend along the (1-100) plane. The short sides SS1 of the n-type fin 1041 are associated with the growth direction of the first doped epitaxial layer 104 due to nature of the wurzite crystal structure. In some embodiments, the short sides SS1 have (1-100) crystal orientation when the growth direction of the first doped epitaxial layer 104 is (11-20) direction. In other words, the short sides SS1 of the n-type fin 1041 extend along the (1-100) plane if the top surface TS1 of the n-type fin 1041 extends along the (11-20) plane. In some embodiments, the short sides SS1 have (11-20) crystal orientation when the growth direction of the first doped epitaxial layer 104 is (1-100) direction. In other words, the short sides SS1 of the n-type fin 1041 extend along the (11-20) plane if the top surface TS1 of the n-type fin 1041 extends along the (1-100) plane.

Due to the above-discussed crystal orientations of different sides/surfaces of the n-type fin 1041, the long sides LS1 of the n-type fin 1041 are polar planes and the short sides SS1 and top surface TS1 of the n-type fin 1041 and the top surface TS2 of the horizontal portion 1042 are non-polar planes. Therefore, interband tunneling may occur at the long sides LS1 of the n-type fin 1041 and not occur at the short sides SS1 and the top surface TS1 of the n-type fin 1041 and the top surface TS2 of the horizontal portion 1042. In this way, the long sides LS1 of the n-type fin 1041 act as active area of the TFET that allows interband tunneling, and the short sides SS1 and top surface TS1 of the n-type fin 1041 and the top surface TS2 of the horizontal portion 1042 act as a tunneling barrier to provide insulation.

In some embodiments, the p-type fin 1061 has a top surface TS3, and the horizontal portion 1062 has a top surface TS4. Since the top surface TS3 of the p-type fin 1061 and top surface TS4 of the horizontal portion 1062 represents the grow direction of the first doped epitaxial layer 106, in some embodiments where the growth direction of the first doped epitaxial layer 106 is (11-20) direction, the top surface TS3 of the p-type fin 1061 and the top surface TS4 of the horizontal portion 1062 of the first doped epitaxial layer 106 may have (11-20) crystal orientation and thus extend along the (11-20) plane. In some embodiments where the growth direction of the first doped epitaxial layer 106 is (1-100) direction, the top surface TS3 of the p-type fin 1061 and the top surface TS4 of the horizontal portion 1042 of the first doped epitaxial layer 106 may have (1-100) crystal orientation and thus extend along the (1-100) plane. The short sides SS2 of the p-type fin 1061 are associated with the growth direction of the first doped epitaxial layer 106 due to nature of the wurzite crystal structure. In some embodiments the short sides SS2 may have (1-100) crystal orientation or extend along the (1-100) plane when the growth direction of the first doped epitaxial layer 106 along (11-20) direction. In some embodiments, the short sides SS2 may have (11-20) crystal orientation or extend along the (11-20) plane when the growth direction of the first doped epitaxial layer 106 is (1-100) direction.

Due to the above-discussed crystal orientations of different sides/surfaces of the p-type fin 1061, the long sides LS2 of the p-type fin 1061 are polar planes and the short sides SS2 and top surface TS3 of the p-type fin 1061 and the top surface TS4 of the horizontal portion 1062 are non-polar planes. Therefore, interband tunneling may occur at the long sides LS2 of the p-type fin 1061 and not occur at the short sides SS2 and top surface TS3 of the p-type fin 1061 and the top surface TS4 of the horizontal portion 1062. In this way, the long sides LS2 of the p-type fin 1061 acts as active area of the TFET that allows interband tunneling, and the short sides SS2 and top surface TS3 of the p-type fin 1061 and the top surface TS4 of the horizontal portion 1062 act as a tunneling barrier to provide insulation.

Figure 5:
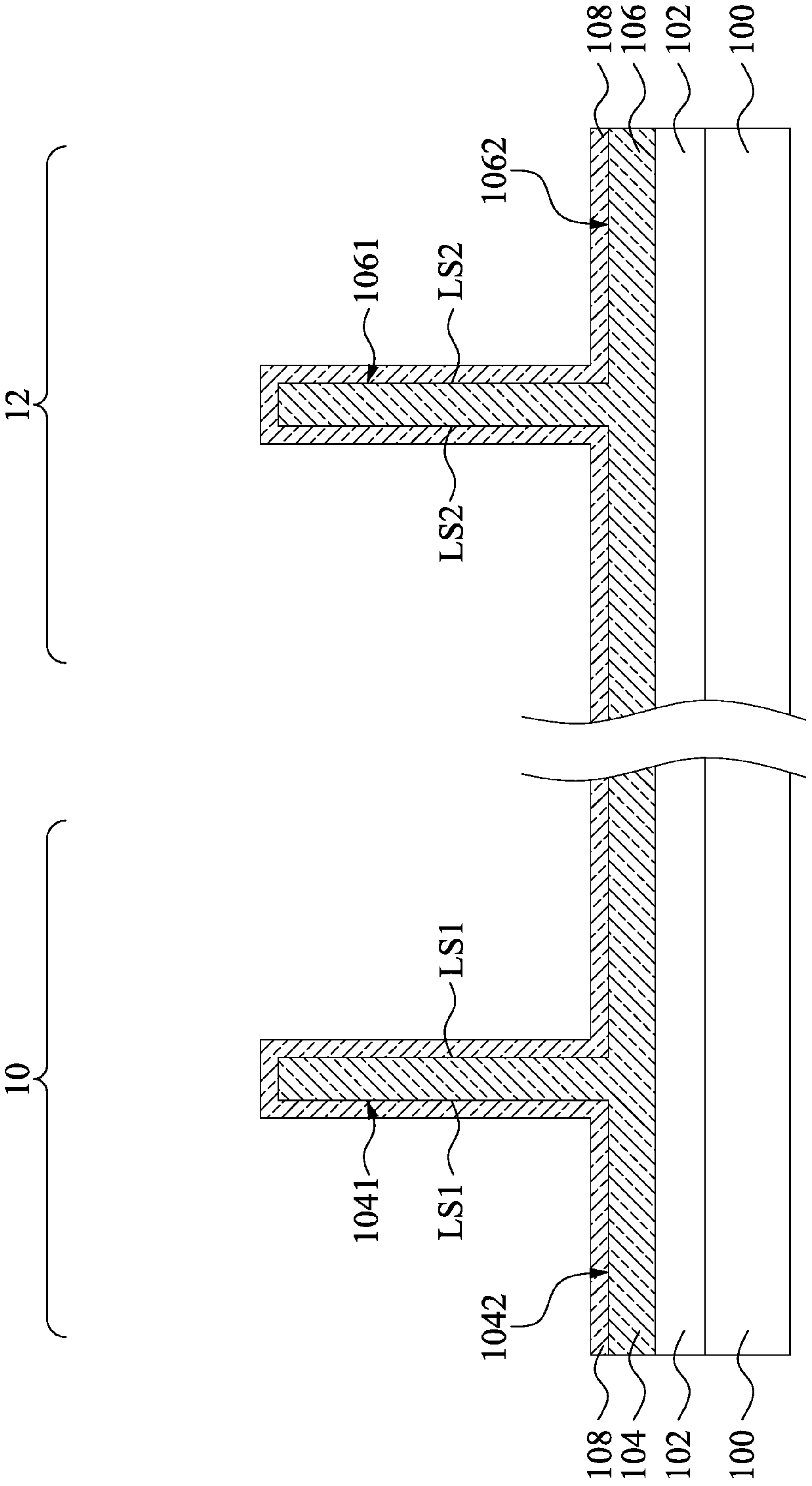

Returning to FIG. 2, the method then proceeds to operation S3 where an interlayer is blanket formed over the substrate. With reference to FIG. 5, in some embodiments of operation S3, an interlayer 108 is blanket formed over the substrate 100 to cover the n-type fin 1041 and horizontal portion 1042 and the p-type fin 1061 and horizontal portion 1062. In some embodiments, the interlayer 108 is made of III-nitride material(s) different from the binary GaN compound of the first doped epitaxial layers 104 and 106. For example, the interlayer 108 is $In_xGa_{1-x}N$, wherein "x" is in a range from about 0.1 to about 1. In further embodiments, the interlayer 108 is a binary indium nitride (InN) compound free from gallium. The difference in composition or material results in the interlayer 108 having a lattice constant different from that of the first doped epitaxial layers 104 and 106, so as to induce strain in the first doped epitaxial layers 104 and 106. The strains induced to the long sides LS1 of the n-type fin 1041 and to the long sides LS2 of the p-type fin 1061 would result in piezoelectric polarization at these long sides LS1 and LS2, which in turn will be advantageous for interband tunneling. In some embodiments, the interlayer 108 is not intentionally doped, for example, not having intentionally placed dopants, but rather having a doping resulting from process contaminants. For example, the interlayer 108 is free from the dopants in the first doped epitaxial layers 104 and 106. In some embodiments, the interlayer 108 is present on one of the long sides LS1 or LS2 only. In detail, one long side LS1 of the n-type fin 1041 is covered by the interlayer 108, and another long side LS1 is free from coverage by the interlayer 108. Similarly, one long side LS2 of the p-type fin 1061 is covered by the interlayer 108, and another long side LS2 of the p-type fin 1061 is free from coverage by the interlayer 108. In some embodiments, the interlayer 108 may be formed by a suitable deposition process, such as chemical vapor deposition (CVD), low pressure CVD (LPCVD), atmospheric pressure CVD (APCVD), ultrahigh vacuum CVD (UHVCVD), atomic layer deposition (ALD), molecular layer deposition (MLD), plasma enhanced CVD (PECVD), metal-organic CVD (MOCVD), molecular beam epitaxy (MBE), sputter deposition, the like, or combinations thereof. In some embodiments where only one long side of the fin is to be covered by the interlayer 108, the deposition of interlayer 108 can be followed by an etching process to remove the interlayer 108 from another long side of the fin. Suitable lithography techniques may be employed to facilitate the etching process.

The interface between the n-type fin 1041 and the interlayer 108 and the interface between the p-type fin 1061 and the interlayer 108 may be referred to as heterojunctions since the material of the fins 1041 and 1061 (e.g., GaN) is different from the material of the interlayer 108 (e.g., InN). In some embodiments, the thickness of the interlayer 108 is in a range from about 1.4 nm to about 2 nm.

Figure 6A:
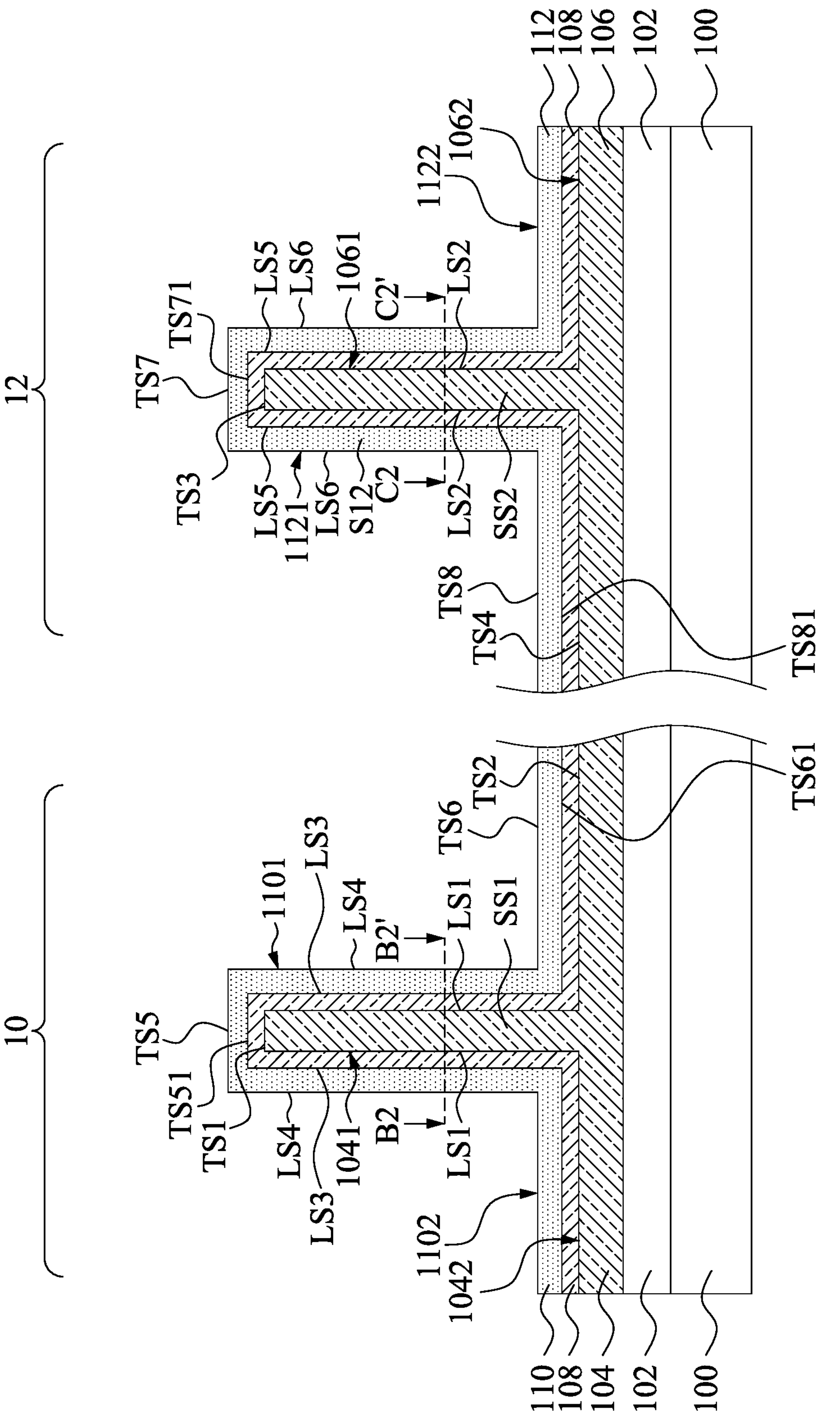
Figure 6B:
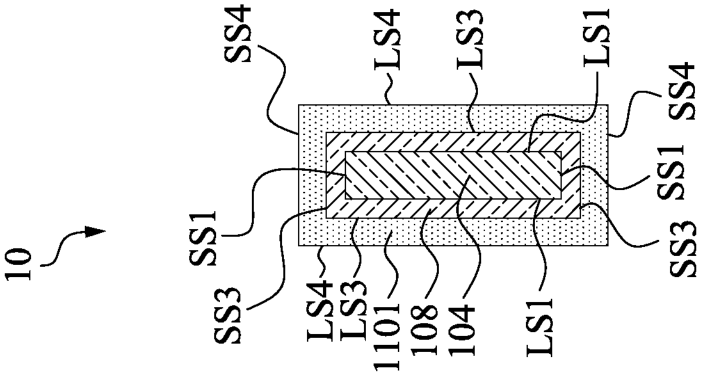
Figure 6C:
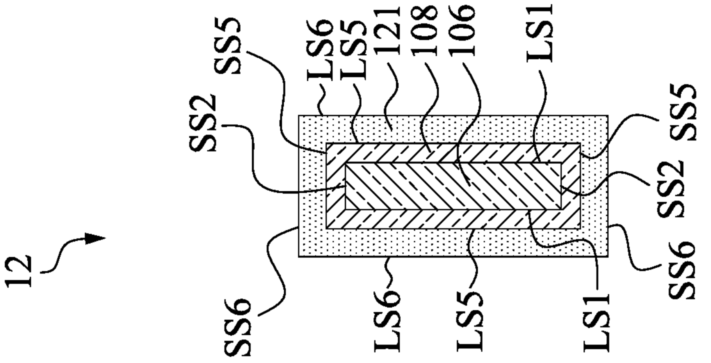

Returning to FIG. 2, the method then proceeds to operation S4 where a second doped epitaxial layer is blanket formed over the substrate. With reference to FIGS. 6A, 6B and 6C, in some embodiments of operation S4, a second doped epitaxial layer 110 is blanket formed over the substrate 100 to cover the interlayer 108 over the p-type TFET region 10 and the n-type TFET region 12. A part of the second doped epitaxial layer 110 surrounding the n-type fin 1041 can be referred to as a shell portion 1101 (also referred to as a semiconductor shell in some embodiments) and a part of the second doped epitaxial layer 110 overlying the horizontal portion 1042 can be referred to as a horizontal portion 1102. Similarly, a part of the second doped epitaxial layer 112 surrounding the p-type fin 1061 can be referred to as a shell portion 1121 and a part of the second doped epitaxial layer 112 overlying the horizontal portion 1062 can be referred to as a horizontal portion 1122. The second doped epitaxial layers 110 and 112 are III-N compound semiconductor layers including a material selected from GaN, InN, AlN, $In_xGa_{(1-x)}N$, $Al_xGa_{(1-x)}N$, $Al_xIn_{(1-x)}N$, $Al_xIn_yGa_{(1-x-y)}N$, the like, and combinations thereof. For example, the second doped epitaxial layers 110 and 112 are made of a binary GaN compound, which is the same as the material of the first doped epitaxial layers 104 and 106. In some embodiments, thickness of the second doped epitaxial layer 110 or 112 may be in a range from about 1 nm to about 5 nm. Formation method of the III-N compound semiconductor layers 110 and 112 includes, for example, metal organic CVD (MOCVD), metal organic vapor phase epitaxy (MOVPE), plasma enhanced CVD (PECVD), remote plasma enhanced CVD (RP-CVD), molecular beam epitaxy (MBE), and hybrid vapor phase epitaxy (HVPE).

In some embodiments where the second doped epitaxial layer 110 for the p-type TFET region 10 is GaN, the doped GaN layer 110 is doped by a p-type dopant, such as, but not limited to, magnesium, calcium, zinc, beryllium, carbon, and combinations thereof. In some embodiments where the second doped epitaxial layer 112 for the n-type TFET region 12 is GaN, the doped GaN layer 112 is doped by an n-type dopant, such as, but not limited to, silicon, oxygen, or a combination thereof. In the p-type TFET region 10, the fin 1041 of n-doped GaN layer 104 resembles a core, the intrinsic InN layer 108 resembles an inner shell surrounding the core, and the shell portion 1101 of p-doped GaN layer 110 resembles an outer shell surrounding the inner shell. The n-doped and p-doped GaN layers 104 and 110 can be respectively referred to as an n-type source layer and a p-type drain layer of a p-type TFET. In the n-type TFET region 12, the fin 1061 of p-doped GaN layer 106 resembles a core, the intrinsic InN layer 108 resembles an inner shell surrounding the core, and the shell portion 1121 of n-doped GaN layer 112 resembles an outer shell surrounding the inner shell. The p-doped and n-doped GaN layers 106 and 112 can be respectively referred to as a p-type source layer and an n-type drain layer of an n-type TFET.

As illustrated in FIGS. 6A-6C, the shell portion 1101 of the p-type drain layer 110 has a top surface TS5, inner and outer long sides LS3 and LS4, and inner and outer short sides SS3 and SS4 shorter than the long sides LS3 and LS4. The horizontal portion 1102 of the p-type drain layer 110 has a top surface TS6. In some embodiments, the inner and outer long sides LS3 and LS4 of the shell portion 1101 of the p-type drain layer 110 extend along c-planes ((0001) plane or (000-1) plane) due to the crystal directions of the long sides LS1 of the n-type fin 1041. For example, the opposite inner long sides LS3 of the p-type drain layer 110 respectively extend along the (0001) plane and the (000-1) plane. Moreover, the top surface TS5 of the shell portion 1101 and the top surface TS6 of the horizontal portion 1102 have the same crystal orientation as the growth direction of the first doped epitaxial layer 104, and hence when the growth direction of the first doped epitaxial layer 104 is (11-20) direction, the top surface TS5 of the shell portion 1101 and the top surface TS6 of the horizontal portion 1102 have (11-20) crystal orientation or extend along the (11-20) plane. Alternatively, when the growth direction of the first doped epitaxial layer 104 is (1-100) direction, the top surface TS5 of the shell portion 1101 and the top surface TS6 of the horizontal portion 1102 have (1-100) crystal orientation or extend along the (1-100) plane. In some embodiments where the top surface TS5 of the shell portion 1101 has (11-20) crystal orientation, the inner and outer short sides SS3 and SS4 of the shell portion 1101 have (1-100) crystal orientation or extend along the (1-100) plane due to nature of the wurtzite crystal structure. Alternatively, in some embodiments where the top surface TS5 of the shell portion 1101 has (1-100) crystal orientation, the inner and outer short sides SS3 and SS4 of the shell portion 1101 may have (11-20) crystal orientation or extend along the (11-20) plane. Due to the crystal orientations of the p-type drain layer 110 as discussed above, the long sides LS3 and LS4 of the shell portion 1101 extend along polar planes ((0001) plane or (000-1) plane) and the short sides SS3 and SS4 and top surface TS5 of the shell portion 1101 and top surface TS6 of the horizontal portion 1102 extend along non-polar planes ((1-100) plane or (11-20) plane).

In some embodiments where the epitaxial layers 104, 108 and 110 are respectively n-doped GaN, InN, and p-doped GaN, the polar long side LS1 of the n-doped GaN layer 104 forms a heterojunction with an inner side of the InN layer 108, and the polar long side LS3 of the p-doped GaN layer 110 forms another heterojunction with an outer side of the InN layer 108. As a result, polar GaN/InN/polar GaN heterojunctions are formed, which in turn will facilitate the interband tunneling between the polar long sides LS1 and LS3 of the GaN layers 104 and 110, as demonstrated in FIGS. 1A and 1B. The thickness of the InN layer 108 is selected to achieve a desired band diagram of the TFET, such as the band diagram as shown in FIG. 1A or FIG. 1B. For example, in some embodiments where the InN layer 108 is about 1.4 nm, the band diagram as shown in FIG. 1A can be achieved. Alternatively, in some embodiments where the InN layer 108 is about 2.4 nm, the band diagram as shown in FIG. 1B can be achieved. If the thickness of the InN layer 108 is increased over 3 nm, the on-current may be unsatisfactory for the TFETs because of an increased tunneling distance. As a result, the thickness of the InN layer 108 is in a range from about 1 nm to about 3 nm, according to various embodiments.

Moreover, the non-polar short side SS1 of the n-doped GaN layer 104 forms a heterojunction with an inner side of the InN layer 108, and the non-polar short side SS3 of the p-doped GaN layer 110 forms another heterojunction with an outer side of the InN layer 108. As a result, non-polar GaN/InN/non-polar GaN heterojunctions are formed, which in turn will impede the interband tunneling between the non-polar short sides SS1 and SS3 of the GaN layers 104 and 110, as demonstrated in FIG. 1C, and thus acts as an insulation region. Similarly, the non-polar top surface TS1 of the fin 1041 of the n-doped GaN layer 104 and the overlying InN layer 108 and p-type GaN layer 110 form non-polar GaN/InN/non-polar GaN heterojunctions, and thus acts as an insulation region. Similarly, the non-polar top surface TS2 of the horizontal portion 1042 of the n-doped GaN layer 104 and the overlying InN layer 108 and p-type GaN layer 110 form non-polar GaN/InN/non-polar GaN heterojunctions, and thus acts as an insulation region. For example, the non-polar GaN/InN/non-polar GaN heterojunctions can provide insulation by reversed pn-junctions, which can be achieved by control of doping, strain and the reversed bias at the GaN/InN/GaN heterojunctions. In some embodiments, the shell portion 1121 of the n-type drain layer 112 has a top surface TS7, inner and outer long sides LS5 and LS6, inner and outer short sides SS5 and SS6 shorter than the long sides LS5 and LS6, and the horizontal portion 1122 of the n-type drain layer 112 has a top surface TS8. In some embodiments, the long sides LS5 and LS6 of the shell portion 1121 of the n-type drain layer 112 extend along c-planes ((0001) plane or (000-1) plane) due to the crystal directions of the long sides LS2 of the p-type fin 1061. For example, opposite long sides LS5 of the shell portion 1121 respectively extend along the (0001) plane and the (000-1) plane. Moreover, the top surface TS7 of the shell portion 1121 and the top surface TS8 of the horizontal portion 1122 have the same crystal orientation as the growth direction of the first doped epitaxial layer 106, and hence when the growth direction of the first doped epitaxial layer 106 is (11-20) direction, the top surface TS7 of the shell portion 1121 and the top surface TS8 of the horizontal portion 1122 also have (11-20) crystal orientation or extend along the (11-20) plane. Alternatively, when the growth direction of the first doped epitaxial layer 106 is (1-100) direction, the top surface TS7 of the shell portion 1121 and the top surface TS8 of the horizontal portion 1122 also have (1-100) crystal orientation or extend along the (1-100) plane. In some embodiments where the top surface TS7 of the shell portion 1121 has (11-20) crystal orientation, the short sides SS5 and SS6 of the shell portion 1121 may have (1-100) crystal orientation or extend along the (1-100) plane due to nature of the wurtzite crystal structure. Alternatively, in some embodiments where the top surface TS7 of the shell portion 1121 has (1-100) crystal orientation, the short sides SS5 and SS6 of the shell portion 1121 may have (11-20) crystal orientation or extend along the (11-20) plane. Due to the crystal orientations as discussed above, the long sides LS5 and LS6 of the shell portion 1121 extend along polar planes ((0001) plane or (000-1) plane), and the short sides SS5 and SS6 and top surface TS7 of the shell portion 1121 and top surface TS8 of the horizontal portion 1122 extend along non-polar planes ((1-100) plane or (11-20) plane).

In some embodiments where the layers 104, 108 and 110 are respectively p-doped GaN, InN, and n-doped GaN, the polar long side LS2 of the p-doped GaN layer 104 forms a heterojunction with an inner side of the InN layer 108, and the polar long side LS5 of the n-doped GaN layer 110 forms another heterojunction with an outer side of the InN layer 108. As a result, polar GaN/InN/polar GaN heterojunctions are formed, which in turn will facilitate the interband tunneling between the polar long sides LS2 and LS5 of the GaN layers 106 and 112, as demonstrated in FIGS. 1A and 1B. The thickness of the InN layer 108 is selected to achieve a desired band diagram of the TFET, such as the band diagram as shown in FIG. 1A or FIG. 1B. For example, in some embodiments where the InN layer 108 is about 1.4 nm, the band diagram as shown in FIG. 1A can be achieved. Alternatively, in some embodiments where the InN layer 108 is about 2.4 nm, the band diagram as shown in FIG. 1B can be achieved. The thickness of the InN layer 108 is in a range from about 1 nm to about 3 nm, according to various embodiments.

Moreover, the non-polar short side SS2 of the p-doped GaN layer 106 forms a heterojunction with an inner side of the InN layer 108, and the non-polar short side SS5 of the n-doped GaN layer 112 forms another heterojunction with an outer side of the InN layer 108. As a result, non-polar GaN/InN/non-polar GaN heterojunctions are formed, which in turn will impede the interband tunneling between the non-polar short sides SS2 and SS5 of the GaN layers 106 and 112, as demonstrated in FIG. 1C, and thus acts as an insulation region. Similarly, the non-polar top surfaces TS3 and TS4 of the p-doped GaN layer 106 and the overlying InN layer 108 and n-type GaN layer 112 form non-polar GaN/InN/non-polar GaN heterojunctions, and thus acts as an insulation region.

Figure 7:
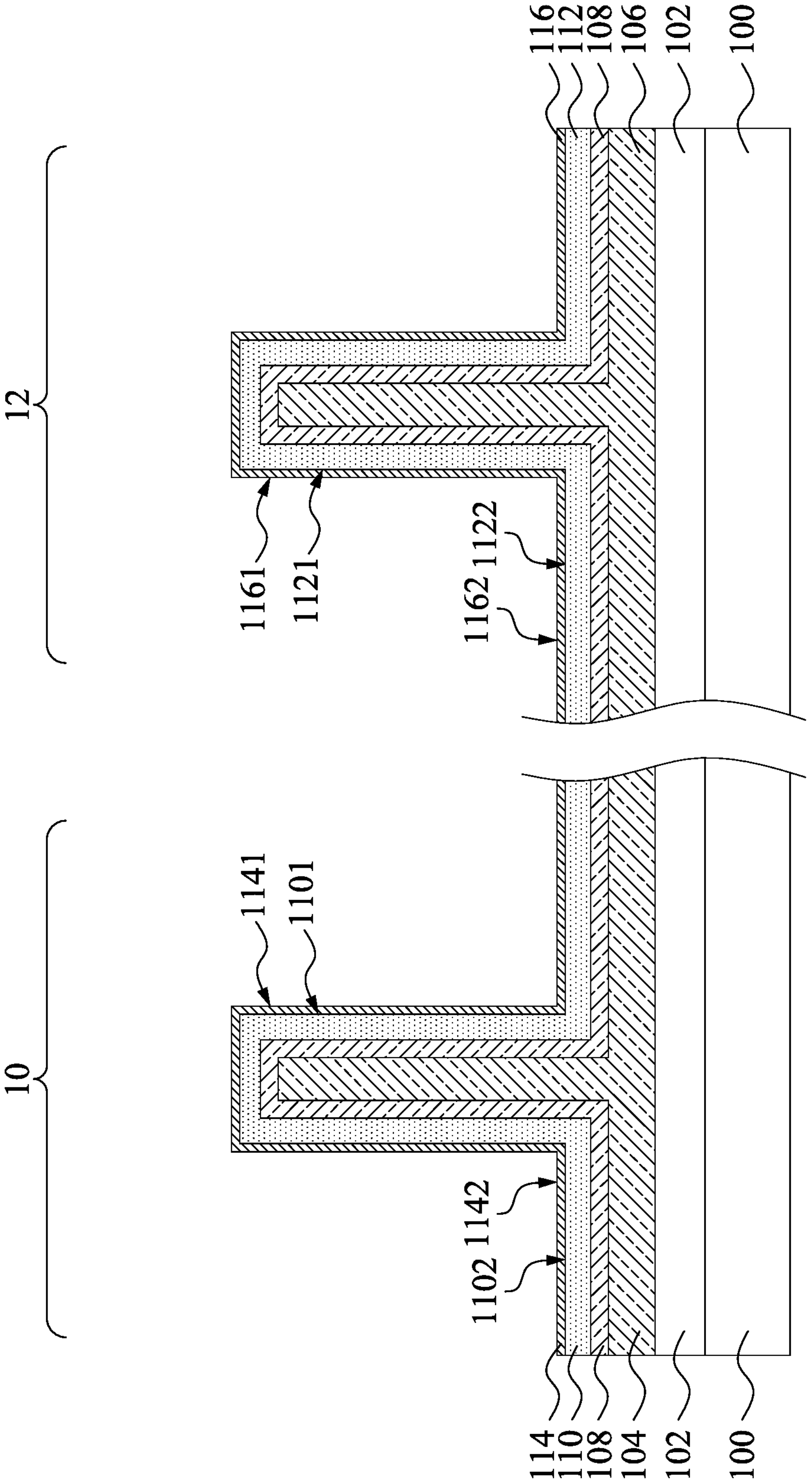

Returning to FIG. 2, the method then proceeds to operation S5 where a high-k dielectric layer and a gate metal layer are formed over the substrate. With reference to FIG. 7, in some embodiments of operation S5, high-k dielectric layers 114 and 116 are formed over the substrate 100 to cover the p-type drain layer 110 and the n-type drain layer 112, respectively. As shown in FIG. 7, the high-k dielectric layer 114 has a shell portion 1141 surrounding the shell portion 1101 of the p-type drain layer 110, and a horizontal portion 1142 covering the horizontal portion 1102 of the p-type drain layer 110. The high-k dielectric layers 114 and 116 are formed by atomic layer deposition (ALD), chemical vapor deposition (CVD), metal organic CVD (MOCVD), physical vapor deposition (PVD), thermal oxidation, or combinations thereof. The high-k dielectric layer 114 and 116 are, for example, a binary or ternary high-k film, such as $HfO_2$, $ZrO_2$, $Al_2O_3$, HfO, LaO, AlO, ZrO, TiO, $Ta_2O_5$, $Y_2O_3$, STO, BTO, BaZrO, HfZrO, HfLaO, HfTaO, HfTiO, the like, or combinations thereof. In some embodiments, the high-k dielectric layers 114 and 116 are formed of the same material. Alternatively, the high-k dielectric layers 114 and 116 are formed of different materials. In some embodiments, a thickness of the high-k dielectric layer 114 or 116 may be in a range from about 1 nm to about 10 nm, for example, about 2 nm.

Figure 8:
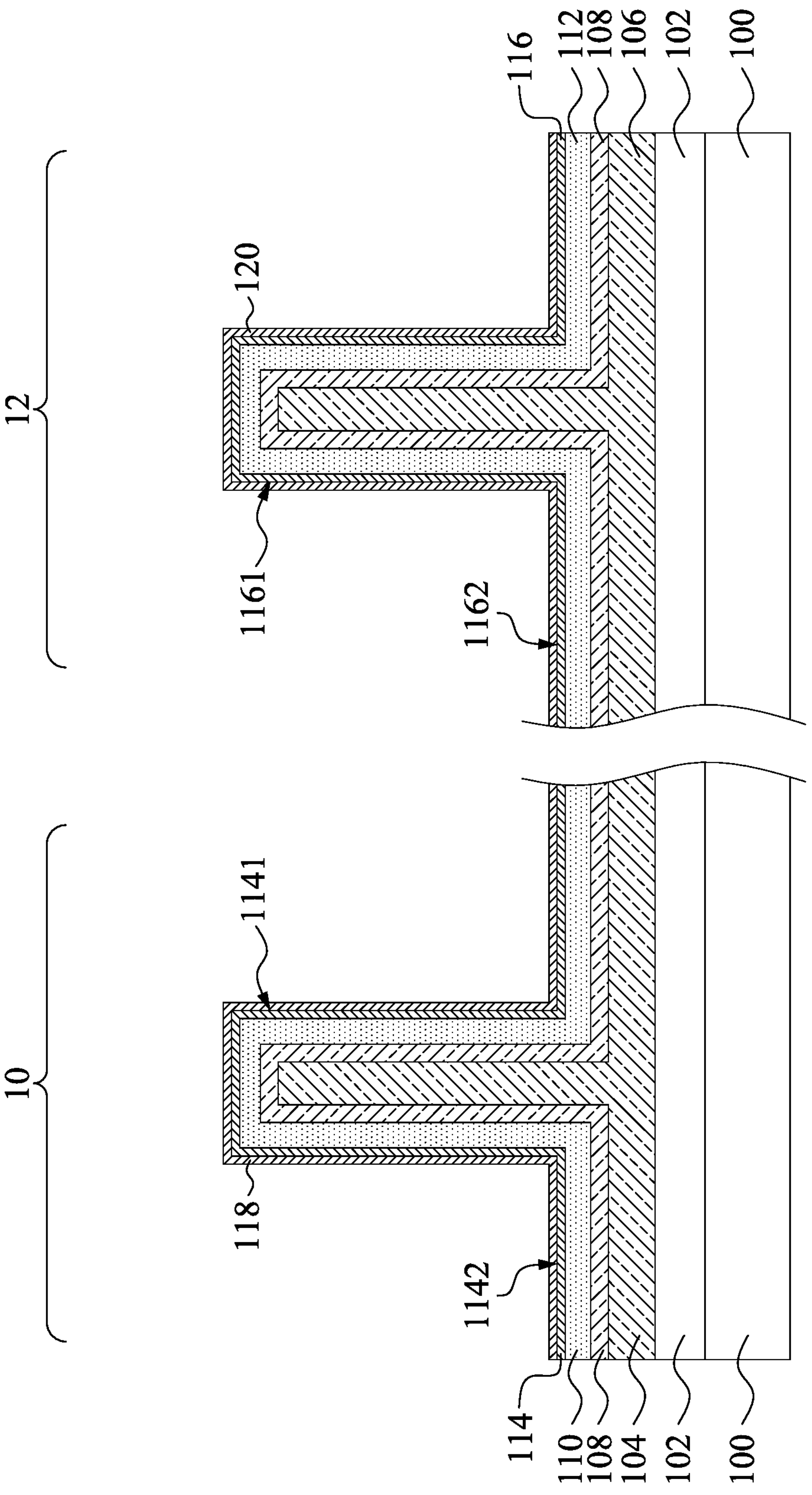

Gate metal layers 118 and 120 are formed on the substrate 100, as illustrate in FIG. 8. In some embodiments, the gate metal layer 118 is blanket formed over the high-k dielectric layer 114 over the p-type TFET region 10, and the gate metal layer 120 is blanket formed over the high-k dielectric layer 116 over the n-type TFET region 12. The gate metal layers 118 and 120 may include different work function metals to provide suitable work functions for the p-type and n-type TFETs, respectively. Example materials of the gate metal layers 118 and 120 include tungsten, titanium nitride, the like or combinations thereof. The gate metal layers 118 and 120 are deposited by ALD, sputter or other processes. In some embodiments, a thickness of the gate metal layer 118 or 120 may be in a range from about 1 nm to about 3 nm, for example, about 2 nm.

Returning to FIG. 2, the method then proceeds to operation S6 where a fill metal layer is formed over the substrate.

Figure 9:
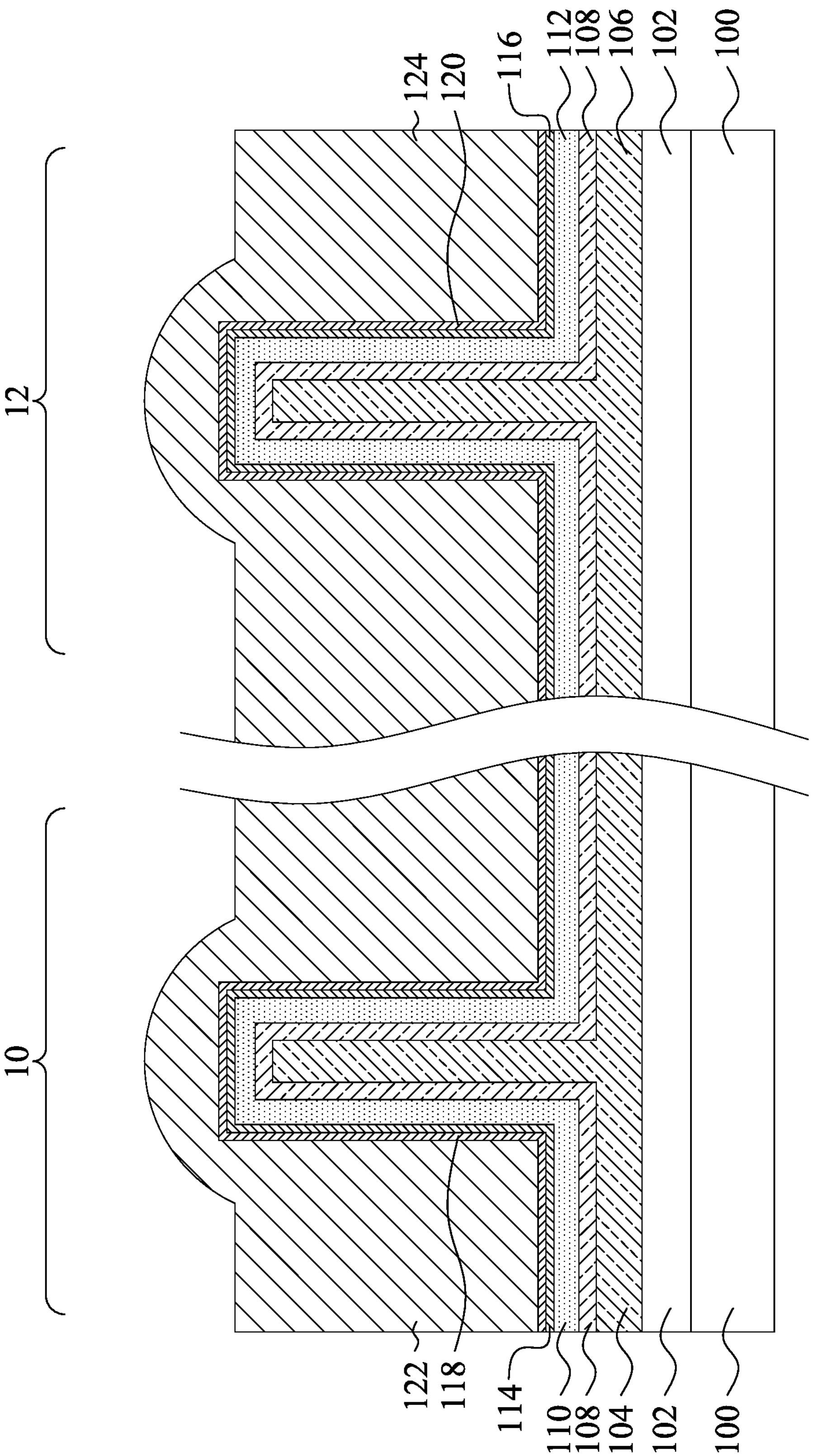
Figure 10:
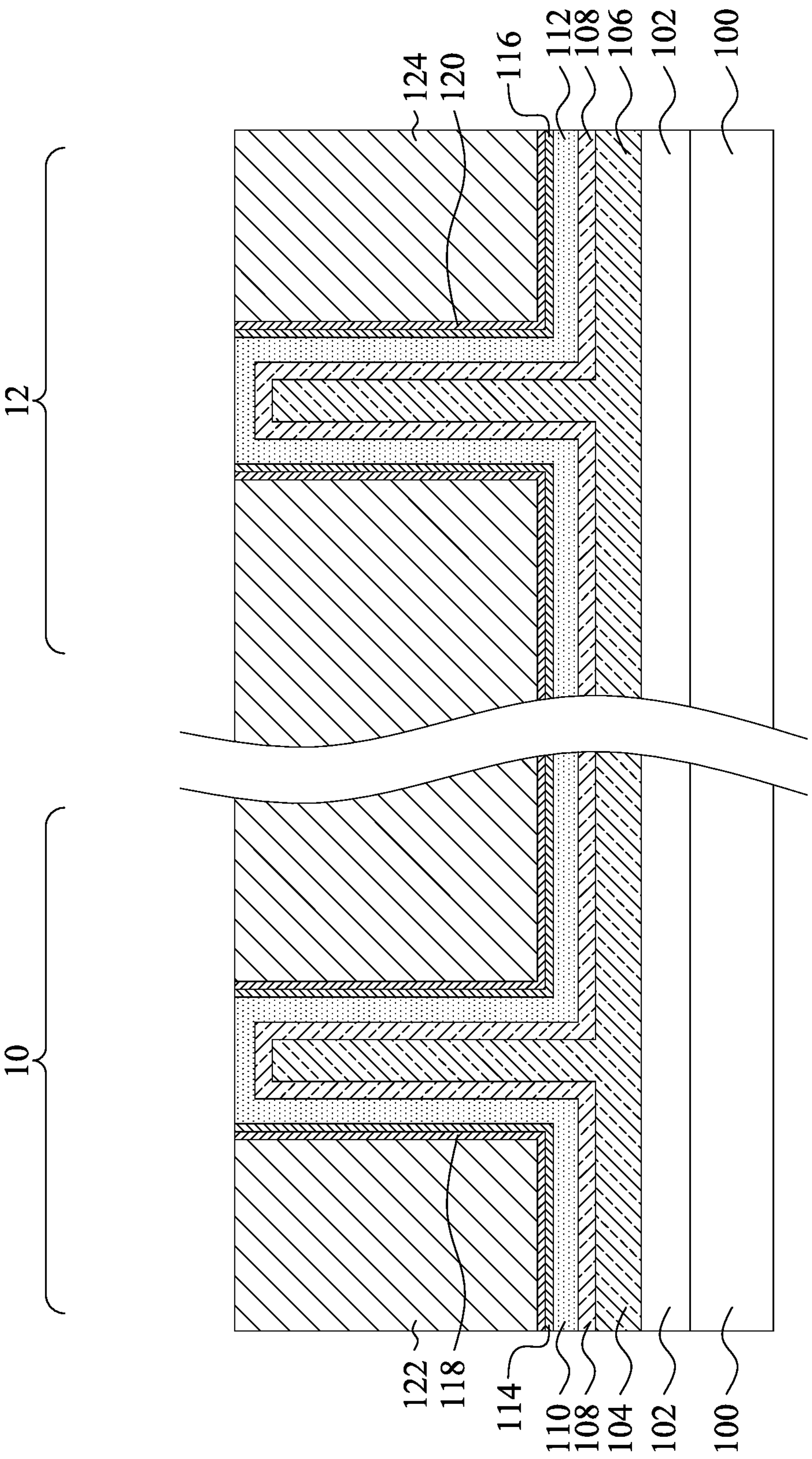

With reference to FIG. 9, in some embodiments of operation S6, fill metal layers 122 and 124 are formed over the substrate 100. The fill metal layers 122 and 124 can be formed by, for example, W, Co, Al, Cu, the like, or combinations thereof. In some embodiments, the fill metal layers 122 and 124 are formed of the same material. Alternatively, the fill metal layers 122 and 124 are formed of different materials. Afterwards, the fill metal layers 122 and 124 are planarized by, for example, chemical mechanical polishing (CMP) until the p-type drain layer 110 and the n-type drain layer 112 are exposed, as illustrated in FIG. 10. In some embodiments, the CMP process results in the top surface of the fill metal layer 122 substantially level with the top surfaces of the gate metal layer 118, the high-k dielectric layer 114 and the p-type drain layer 110. Similarly, the CMP process results in the top surface of the fill metal layer 124 substantially level with the top surfaces of the gate metal layer 120, the HK dielectric layer 116 and the n-type drain layer 112.

Figure 11:
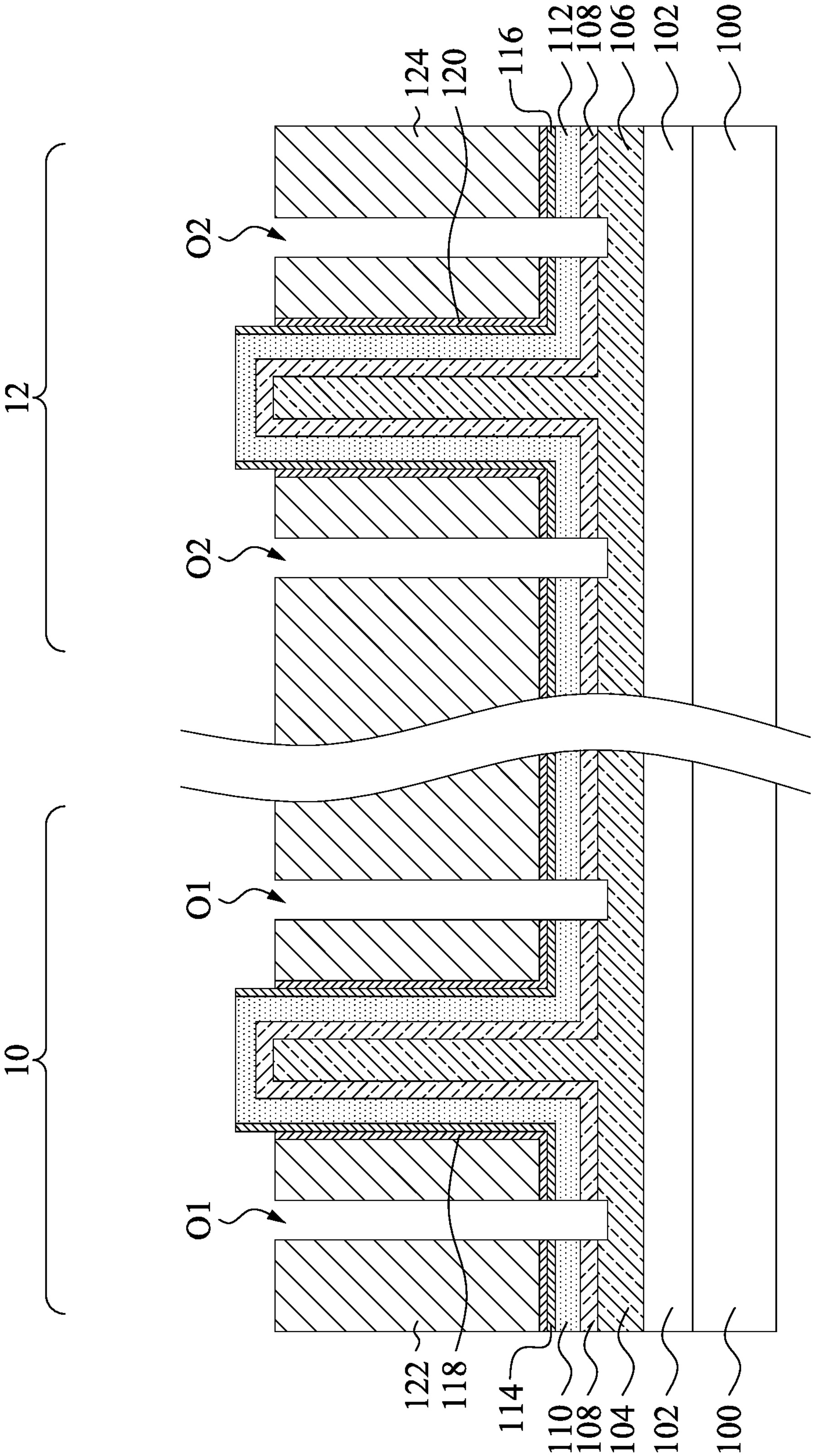

Returning to FIG. 2, the method then proceeds to operation S7 where openings are formed in the metal fill layers. With reference to FIG. 11, in some embodiments of operation S7, openings O1 are formed through the metal fill layer 122, the gate metal layer 118, the high-k dielectric layer 114, the p-type drain layer 110, the interlayer 108, and in the n-type source layer 104. Similarly, openings O2 are formed through the metal fill layer 124, the gate metal layer 120, the high-k dielectric layer 116, the p-type drain layer 110, the interlayer 108, and in the n-type source layer 104. The openings O1 and O2 may be formed using suitable etching techniques, such as wet etching, dry etching or combinations thereof. In some embodiments, the etching process results in top surfaces of the fill metal layer 122 and the gate metal layer 118 lower than top surfaces of the high-k gate dielectric layer 114 and the p-type drain layer 110. Similarly, the etching process results in top surfaces of the fill metal layer 124 and the gate metal layer 120 lower than top surfaces of the high-k gate dielectric layer 116 and the n-type drain layer 112.

Figure 12:
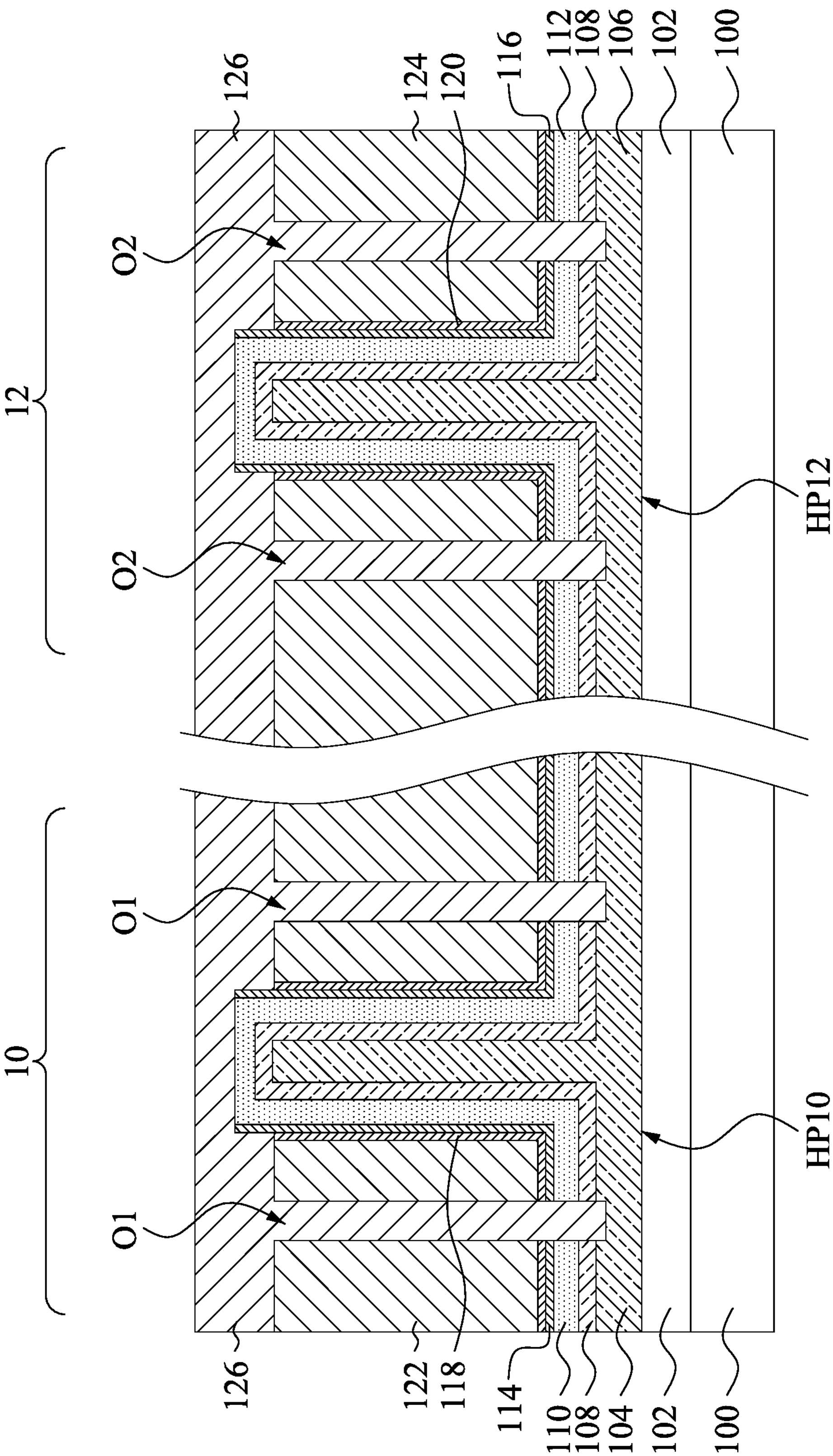

Returning to FIG. 2, the method then proceeds to operation S8 where the openings are overfilled with an insulation layer. With reference to FIG. 12, in some embodiments of operation S8, the openings O1 and O2 are overfilled with an insulation layer 126 by using, for example, CVD, PVD, spin-coating, the like, or combinations thereof. Overfilling the openings O1 and O2 results in that the fill metal layers 122 and 124, gate metal layers 118 and 120, high-k dielectric layers 114 and 116, p-type drain layer 110 and n-type drain layer 112 covered by the insulation layer 126.

After filling the openings with insulation layer, further TFET processes are performed to form various features such as contacts/vias, interlayer dielectric layers, interconnect metal layers, and passivation layers, etc.

Based on the above discussions, it can be seen that the present disclosure offers advantages. It is understood, however, that other embodiments may offer additional advantages, and not all advantages are necessarily disclosed herein, and that no particular advantages are required for all embodiments. One advantage is that polar GaN/InN/polar GaN heterojunctions facilitate interband tunneling of a TFET. Another advantage is that improved on-current per chip area is achieved since the fin (or core) of the TFET is oriented in such a way that polar sidewalls are larger than non-polar sidewalls. Another advantage is that the TFET action occurs radially (i.e., from an inner GaN core to an outer GaN shell in a horizontal direction), which in turn will result in improved active area as long as the GaN core is formed with a tall polar sidewall. Yet another advantage is that out-diffusion of the dopant from the fin (or core) to the surrounding InN shell and doped GaN shell can be prevented because the InN shall and the doped GaN shell are formed after forming the fin by etching a doped GaN layer. Yet another advantage is that the source and drain of the TFET may be made of the same III-N semiconductor, which in turn will be suitable for CMOS process integration.

In some embodiments of the present disclosure, a method includes forming a first epitaxial layer having a first dopant over a substrate; etching the first epitaxial layer to form a fin with a polar sidewall; and forming in sequence a semiconductor interlayer and a second epitaxial layer to surround the fin, in which the second epitaxial layer has a second dopant with a different conductivity type than the first dopant.

In some embodiments of the present disclosure, a method includes forming a first epitaxial layer having a first dopant over a substrate; etching the first epitaxial layer, such that the etched first epitaxial layer has a horizontal portion and a fin extending upwardly from the horizontal portion; and forming a semiconductor interlayer along the horizontal portion and the fin of the first epitaxial layer; and forming a second epitaxial layer having a second dopant over the semiconductor interlayer, such that the second epitaxial layer has a shell portion wrapping around the fin of the first epitaxial layer and a horizontal portion overlying the horizontal portion of the first epitaxial layer, in which a first sidewall of the shell portion of the second epitaxial layer extends along a polar plane, and a top surface of the horizontal portion of the second epitaxial layer extends along a non-polar plane.

In some embodiments of the present disclosure, a method includes growing a first epitaxial layer over a substrate, in which a growth direction of the first epitaxial layer is along a non-polar direction; etching the first epitaxial layer to form a fin over the substrate, such that the fin has a polar sidewall and a non-polar sidewall, in which the polar sidewall is substantially perpendicular to the non-polar sidewall when viewed from above; forming a semiconductor interlayer over the fin; and forming a second epitaxial layer over the semiconductor interlayer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a first epitaxial layer having a first dopant over a substrate;

etching the first epitaxial layer to form a fin with a polar sidewall; and forming in sequence a semiconductor interlayer and a second epitaxial layer to surround the fin, wherein the second epitaxial layer has a second dopant with a different conductivity type than the first dopant.

2. The method of claim 1, wherein forming the first epitaxial layer is performed such that the first epitaxial layer has a top surface with a (11-20) or a (1-100) crystal direction.

3. The method of claim 2, wherein the substrate is oriented to have a top surface extending along a (112) plane or a (110) plane during forming the first epitaxial layer.

4. The method of claim 1, wherein etching the first epitaxial layer is performed such that the etched epitaxial layer has a horizontal portion, the fin extends upwardly from the horizontal portion of the etched first epitaxial layer, and wherein a top surface of the horizontal portion is on a non-polar plane.

5. The method of claim 4, further comprising:

forming a gate metal layer over the fin and the horizontal portion of the etched first epitaxial layer;

etching the gate metal layer to form an opening exposing the horizontal portion of the etched first epitaxial layer; and forming an insulation layer to fill the opening in the gate metal layer.

6. The method of claim 5, wherein etching the gate metal layer is performed such that the top surface of the horizontal portion of the etched first epitaxial layer is lowered.

7. The method of claim 5, wherein forming the insulation layer is performed such that the insulation layer extends across a top surface of the fin, and the top surface of the fin is on a non-polar plane.

8. The method of claim 1, wherein etching the first epitaxial layer to form the fin is performed such that the fin has a non-polar sidewall connected to the polar sidewall, and the non-polar sidewall is shorter than the polar sidewall when viewed from above.

9. The method of claim 8, wherein forming the semiconductor interlayer is performed such that the semiconductor interlayer extending along the polar sidewall and the non-polar sidewall of the fin.

10. A method, comprising:

forming a first epitaxial layer having a first dopant over a substrate;

etching the first epitaxial layer, such that the etched first epitaxial layer has a horizontal portion and a fin extending upwardly from the horizontal portion;

forming a semiconductor interlayer along the horizontal portion and the fin of the first epitaxial layer; and forming a second epitaxial layer having a second dopant over the semiconductor interlayer, such that the second epitaxial layer has a shell portion wrapping around the fin of the first epitaxial layer and a horizontal portion overlying the horizontal portion of the first epitaxial layer, wherein a first sidewall of the shell portion of the second epitaxial layer extends along a polar plane, and a top surface of the horizontal portion of the second epitaxial layer extends along a non-polar plane.

11. The method of claim 10, wherein the first sidewall of the shell portion of the second epitaxial layer extends along (0001) plane or a (000-1) plane of a wurtzite crystal structure of the second epitaxial layer.

12. The method of claim 10, wherein the first dopant and the second dopant are of opposite conductivity types.

13. The method of claim 10, wherein forming the second epitaxial layer is performed such that the shell portion of the second epitaxial layer has a second sidewall connected to the first sidewall, and the second sidewall extends along a non-polar plane and is shorter than the first sidewall when viewed from above.

14. The method of claim 10, wherein the shell portion of the second epitaxial layer has a non-polar top surface, and the method further comprising:

forming in sequence a high-k dielectric layer, a gate metal layer, and a filling metal over the second epitaxial layer; and performing a CMP process to the high-k dielectric layer, the gate metal layer, and the filling metal over the second epitaxial layer until the non-polar top surface of the shell portion of the second epitaxial layer is exposed.

15. The method of claim 14, further comprising etching the gate metal layer and the filling metal to form an opening extending through the gate metal layer and the filling metal, wherein etching the gate metal layer and the filling metal is performed such that a top end of the gate metal layer is lower than the non-polar top surface of the shell portion of the second epitaxial layer.

16. A method, comprising:

growing a first epitaxial layer over a substrate, wherein a growth direction of the first epitaxial layer is along a non-polar direction;

etching the first epitaxial layer to form a fin over the substrate, such that the fin has a polar sidewall and a non-polar sidewall, wherein the polar sidewall is substantially perpendicular to the non-polar sidewall when viewed from above;

forming a semiconductor interlayer over the fin; and forming a second epitaxial layer over the semiconductor interlayer.

17. The method of claim 16, wherein etching the first epitaxial layer is performed such that an area of the polar sidewall is greater than an area of the non-polar sidewall.

18. The method of claim 16, wherein the first epitaxial layer and the second epitaxial layer comprises GaN, and the semiconductor interlayer comprises InN.

19. The method of claim 16, wherein forming the second epitaxial layer is performed such that the second epitaxial layer covers the polar sidewall and the non-polar sidewall of the fin.

20. The method of claim 16, wherein forming the second epitaxial layer is performed such that the second epitaxial layer comprises a polar sidewall and a non-polar sidewall, the polar sidewall of the second epitaxial layer extends along a same direction as the polar sidewall of the fin, and the non-polar sidewall of the second epitaxial layer extends along a same direction as the non-polar sidewall of the fin.

* * * * *